(12) United States Patent
Mihajlovic et al.

(10) Patent No.: US 10,891,999 B1
(45) Date of Patent: Jan. 12, 2021

(54) PERPENDICULAR SOT MRAM

(71) Applicant: WESTERN DIGITAL TECHNOLOGIES, INC., San Jose, CA (US)

(72) Inventors: Goran Mihajlovic, San Jose, CA (US); Michael Grobis, Campbell, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/458,651

(22) Filed: Jul. 1, 2019

Related U.S. Application Data (60) Provisional application No. 62/863,527, filed on Jun. 19, 2019.

(51) Int. Cl.
  *G11C 11/16* (2006.01)
  *H01L 43/08* (2006.01)
  *H01L 43/06* (2006.01)

(52) U.S. Cl.
  CPC ........ *G11C 11/1675* (2013.01); *G11C 11/161* (2013.01); *G11C 11/1655* (2013.01); *G11C 11/1657* (2013.01); *G11C 11/1673* (2013.01); *H01L 43/06* (2013.01); *H01L 43/08* (2013.01)

(58) Field of Classification Search
  CPC .............. G11C 11/1675; G11C 11/161; G11C 11/1655; G11C 11/1657; G11C 11/1673; H01L 43/06; H01L 43/08
  USPC ........................................................ 365/158
  See application file for complete search history.

(56) References Cited

U.S. PATENT DOCUMENTS

| | | | |
|---|---|---|---|
| 6,937,434 B2 | 8/2005 | Takahashi | |
| 9,269,415 B1 | 2/2016 | Liu | |
| 9,830,966 B2 | 11/2017 | Mihajlovic | |
| 9,837,602 B2 | 12/2017 | Braganca | |
| 9,953,692 B1 | 4/2018 | Mihajlovic | |
| 10,134,457 B1 | 11/2018 | Mihajlovic | |
| 10,211,393 B2 | 2/2019 | Mihajlovic | |
| 10,229,723 B1 | 3/2019 | Choi | |
| 2003/0039062 A1* | 2/2003 | Takahasahi | G11B 5/374 360/112 |
| 2005/0269612 A1* | 12/2005 | Torok | G11C 11/16 257/295 |

(Continued)

FOREIGN PATENT DOCUMENTS

CN  105514260  4/2016

OTHER PUBLICATIONS

PCT International Search Report dated Mar. 24, 2020, PCT Patent Application No. PCT/US2019/066665.

(Continued)

*Primary Examiner* — Sung Il Cho
(74) *Attorney, Agent, or Firm* — Vierra Magen Marcus LLP (57) ABSTRACT

A MRAM memory cell comprises a SHE layer, a magnetic bit layer with perpendicular anisotropy and an Oersted layer. The magnetic bit layer has a switchable direction of magnetization in order to store data. Data is written to the MRAM memory cell using the Spin Hall Effect so that spin current generated in the SHE layer exerts a torque on the magnetic bit layer while the Oersted layer provides heat and an Oersted field to enable deterministic switching. Data is read form the MRAM memory cell using the Anomalous Hall Effect and sensing voltage at the Oersted layer.

19 Claims, 11 Drawing Sheets

(56) References Cited

U.S. PATENT DOCUMENTS

| | | | |
|---|---|---|---|
| 2006/0291276 A1* | 12/2006 | Nozieres | G11C 11/16 |
| | | | 365/158 |
| 2009/0273972 A1* | 11/2009 | Han | H01F 10/3263 |
| | | | 365/173 |
| 2010/0091555 A1* | 4/2010 | Fukami | B82Y 10/00 |
| | | | 365/158 |
| 2011/0169112 A1* | 7/2011 | Chen | B82Y 25/00 |
| | | | 257/421 |
| 2014/0124882 A1 | 5/2014 | Amid | |
| 2014/0169088 A1* | 6/2014 | Buhrman | H01F 10/3286 |
| | | | 365/158 |
| 2014/0269036 A1* | 9/2014 | Pi | G11C 11/18 |
| | | | 365/158 |
| 2015/0041934 A1 | 2/2015 | Khvalkovskiy | |
| 2017/0077392 A1* | 3/2017 | Han | G11C 11/18 |
| 2017/0178705 A1 | 7/2017 | Buhrman | |
| 2017/0249981 A1* | 8/2017 | Nebashi | H01L 29/82 |
| 2018/0033954 A1* | 2/2018 | Aradhya | H01F 10/3272 |
| 2018/0090194 A1 | 3/2018 | Silva | |
| 2018/0301177 A1* | 10/2018 | Nakatsuji | H01L 43/04 |
| 2018/0358542 A1 | 12/2018 | Mihajlovic | |
| 2020/0106001 A1* | 4/2020 | Gupta | H01L 43/08 |

OTHER PUBLICATIONS

PCT Written Opinion of the International Searching Authority dated Mar. 24, 2020, PCT Patent Application No. PCT/US2019/066665.
Ahmed, et al., "A Comparative Study Between Spin-Transfer-Torque and Spin-Hall-Effect Switching Mechanisms in PMTJ Using SPICE," IEEE Journal on Explaratory Solid-State Computational Devices and Circuits, vol. 3, 2017.

\* cited by examiner

PERPENDICULAR SOT MRAM

This application claims priority to Provisional Application No. 62/863,527, filed on Jun. 19, 2019, titled "PERPENDICULAR SOT MRAM," which application is incorporated herein by reference in its entirety.

BACKGROUND

Memory is widely used in various electronic devices such as cellular telephones, digital cameras, personal digital assistants, medical electronics, mobile computing devices, non-mobile computing devices and data servers. Memory may comprise non-volatile memory or volatile memory. A non-volatile memory allows information to be stored and retained even when the non-volatile memory is not connected to a source of power (e.g., a battery).

One example of a non-volatile memory is a Spin Orbit Torque (SOT) magnetoresistive random access memory, which uses magnetization to represent stored data, in contrast to some other memory technologies that use electronic charges to store data. Generally, magnetoresistive random access memory includes a large number of magnetic memory cells formed on a semiconductor substrate, where each memory cell represents one bit of data. A bit of data is written to a memory cell by changing the direction of magnetization of a magnetic element within the memory cell, and a bit is typically read by measuring the resistance of the memory cell (low resistance typically represents a "0" bit and high resistance typically represents a "1" bit). As used herein, direction of magnetization is the direction that the magnetic moment is oriented.

Although SOT magnetoresistive random access memory is a promising technology, previous SOT magnetoresistive random access memory cells operated inefficiently and/or did not switch deterministically. Magnetoresistive random access memory cells are also challenging to fabricate at high areal density without sidewall shunting across the tunnel barrier.

BRIEF DESCRIPTION OF THE DRAWINGS

Like-numbered elements refer to common components in the different figures.

DETAILED DESCRIPTION

Figure 1:
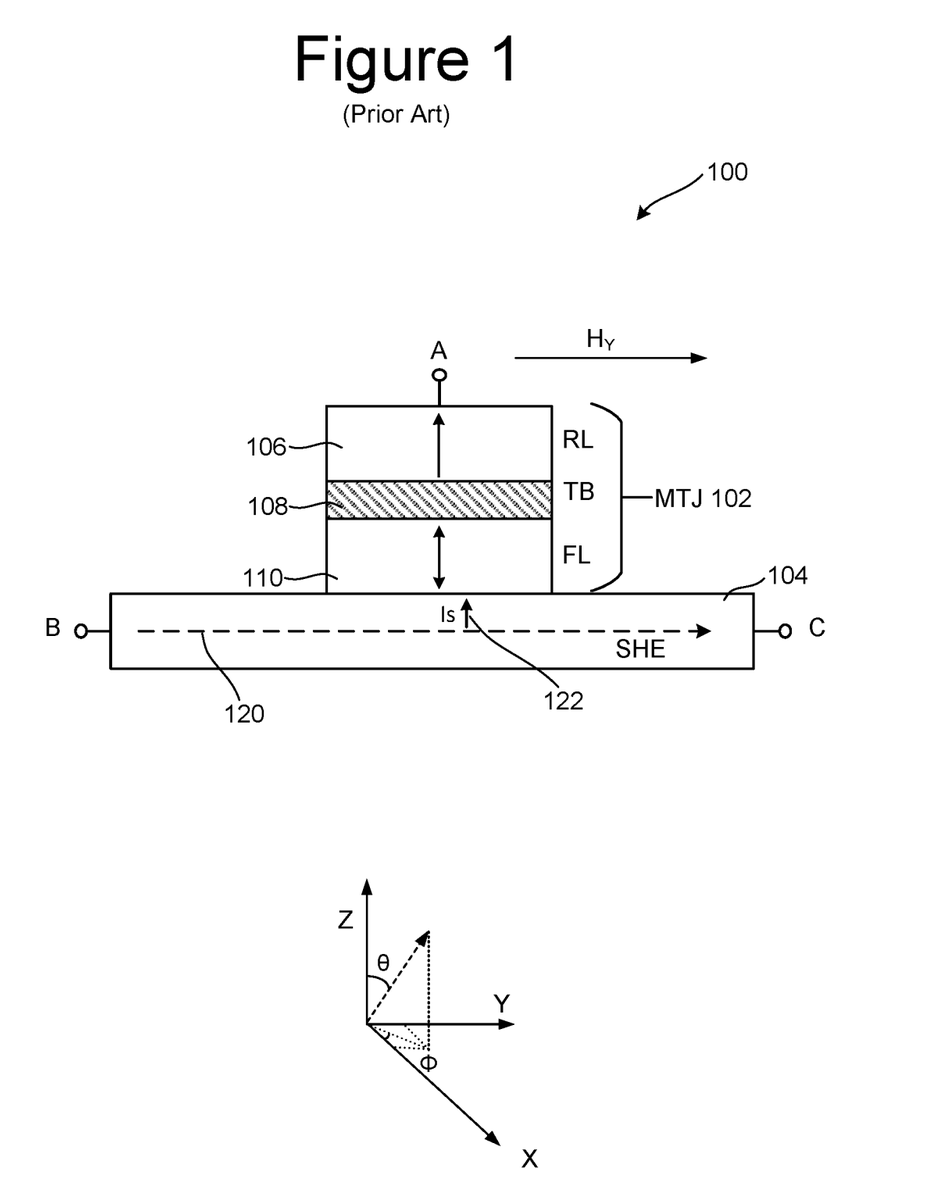
FIG. 1 is a block diagram of a magnetoresistive random access memory cell.

FIG. 1 is a schematic perspective view of a prior art Spin Orbit Torque (SOT) magnetoresistive random access memory cell 100 that includes three terminals A, B and C; a magnetic tunnel junction (MTJ) 102; and a Spin Hall Effect (SHE) layer 104. MTJ 102 comprises a reference layer (RL) 106, a free layer (FL) 110, and a tunnel barrier (TB) 108 positioned between the reference layer (RF) 106 and free layer (FL) 110. Tunnel barrier 108 is an insulating layer. Free layer 110 is a ferromagnetic layer and has a direction of magnetization that can be switched. Reference layer 106 is a ferromagnetic layer with a fixed direction of magnetization. Reference layer 106 is usually a synthetic antiferromagnetic layer which comprises several magnetic and non-magnetic layers, but for the purpose of this illustration it is depicted as a single layer 106 with fixed direction of magnetization.

When the direction of magnetization in free layer 110 is parallel to the direction of magnetization of reference layer 106, the resistance across memory cell 100 is relatively low due, at least in part, to spin dependent scattering of the minority electrons. When the magnetization in free layer 110 is anti-parallel to the magnetization in reference layer 106, the resistance across memory cell 100 is relatively high due, at least in part, to spin dependent scattering of minority and majority electrons. The data ("0" or "1") in memory cell 100 is read by measuring the resistance of the memory cell 100.

The spin of the electron is an intrinsic angular momentum, which is separate from the angular momentum due to its orbital motion. In a solid, the spins of many electrons can act together to affect the magnetic and electronic properties of a material, for example endowing it with a permanent magnetic moment as in a ferromagnet. In many materials, electron spins are equally present in both the up and the down directions, and no transport properties are dependent on spin. However, various techniques can be used to generate a spin-polarized population of electrons, resulting in an excess of spin up or spin down electrons, in order to change the properties of a material. This spin-polarized population of electrons moving in a common direction through a common material is referred to as a spin current. As described herein, a spin current can be used to operate a magnetoresistive random access memory cell.

The Spin Hall Effect is a transport phenomenon consisting of the generation of spin current in a sample carrying electric current. This spin current can accumulate spins at the lateral surfaces of the sample. The opposing surface boundaries will have spins of opposite sign. The Spin Hall Effect may be used to generate spin current flowing in a transverse (perpendicular to plane) direction when applying an electrical current flow in a longitudinal (in-plane) direction. The spin polarization direction of such an SHE-generated spin current is in the in-plane direction orthogonal to the charge current flow. For example, an electrical current 120 through SHE layer 104 (from terminal B to terminal C) results in a spin current 122, with direction of spin polarization into the page, being injected up into the free layer 110. Spin current 122, generated from electrical current 120, injected into the free layer 110 exerts a spin torque on free layer 110 which causes free layer 100 to change direction of magnetization in such a way so that the magnetization rotates in the y-z plane.

The chirality of the rotation will depend on the polarization direction of the spin current 122 injected into the free layer 110. If the spin current 122 is polarized into the page, chirality of the free layer rotation will be clockwise. But if the spin current 122 is polarized out of the page, which can be achieved simply by applying an electrical current through SHE layer 104 opposite in polarity from electrical current 120, then chirality of the free layer rotation in the y-z plane will be clockwise. Spin current 122 can be polarized out of the page also if the SHE material used for SHE layer 104 has the opposite sign of the spin Hall angle. For example, for the current polarity 120, if SHE material is tungsten W, then spin polarization of the spin current 122 will be into the page. But for the current polarity 120, if SHE material is platinum Pt, then spin polarization of the spin current 122 will be out of the page.

The SOT magnetoresistive random access memory cells proposed in the prior art require a magnetic bias field $H_Y$ to be applied (see FIG. 1) to the free layer 110, parallel to the direction of write current 120, in order to deterministically switch the direction of magnetization of the free layer, as such field will allow only one stable state for the given polarization direction of the spin current 122. For example, if spin current 122 is polarized into the page and thus rotates the free layer 110 clockwise, then applying $H_Y$ in the positive y direction will make free layer 110 magnetization direction down to be stable, thus this configuration can be used to switch the free layer 110 magnetization direction from up to down, or from parallel to the reference layer 106 to anti-parallel to the reference layer 106. If, however, magnetic field $H_Y$ is applied in the negative y direction, then for the same polarization direction of the spin current 122 into the page will make free layer 110 magnetization direction up to be stable, thus this configuration can be used to switch the free layer 110 magnetization direction from down to up, or from antiparallel to the reference layer 106 to parallel to the reference layer 106. Thus, magnetic bias field $H_Y$ is required to achieve deterministic switching of the free layer 110. However, providing a source of that magnetic bias field can make scaling the memory difficult. Additionally, proposed designs have been inefficient and complicated. Also, reading the memory cell of FIG. 1 required passing a current through the tunnel barrier, which over time can lead to a breakdown of the tunnel barrier and breakdown of the MRAM cell.

For a SOT magnetoresistive random access memory cell, a large threshold current density is needed to switch the direction of magnetization of the free layer 110. That threshold current density is expressed as:

$$J_{th} = \frac{2eM_S t_F}{\hbar \theta_{SH}^*} \left( \frac{H_K^{eff*}}{2} - \frac{H_Y}{\sqrt{2}} \right) \quad \text{Equation 1}$$

where:
- e=electron charge
- $M_S$=saturation magnetization of the free layer
- $t_F$=thickness of the free layer
- h=Planck constant divided by $2\pi$
- $\theta_{SH}^*$=effective Spin Hall Angle
- $H_K^{eff*}$=effective perpendicular anisotropy field
- $H_Y$=external filed parallel to the electrical current in the SHE layer There is a need for a design of a SOT magnetoresistive random access memory cell that is not complicated, can provide the necessary field to enable deterministic switching, reduces current density needed for switching, and will avoid the degrading of the MTJ due to running a current through the MTJ.

Figure 2:
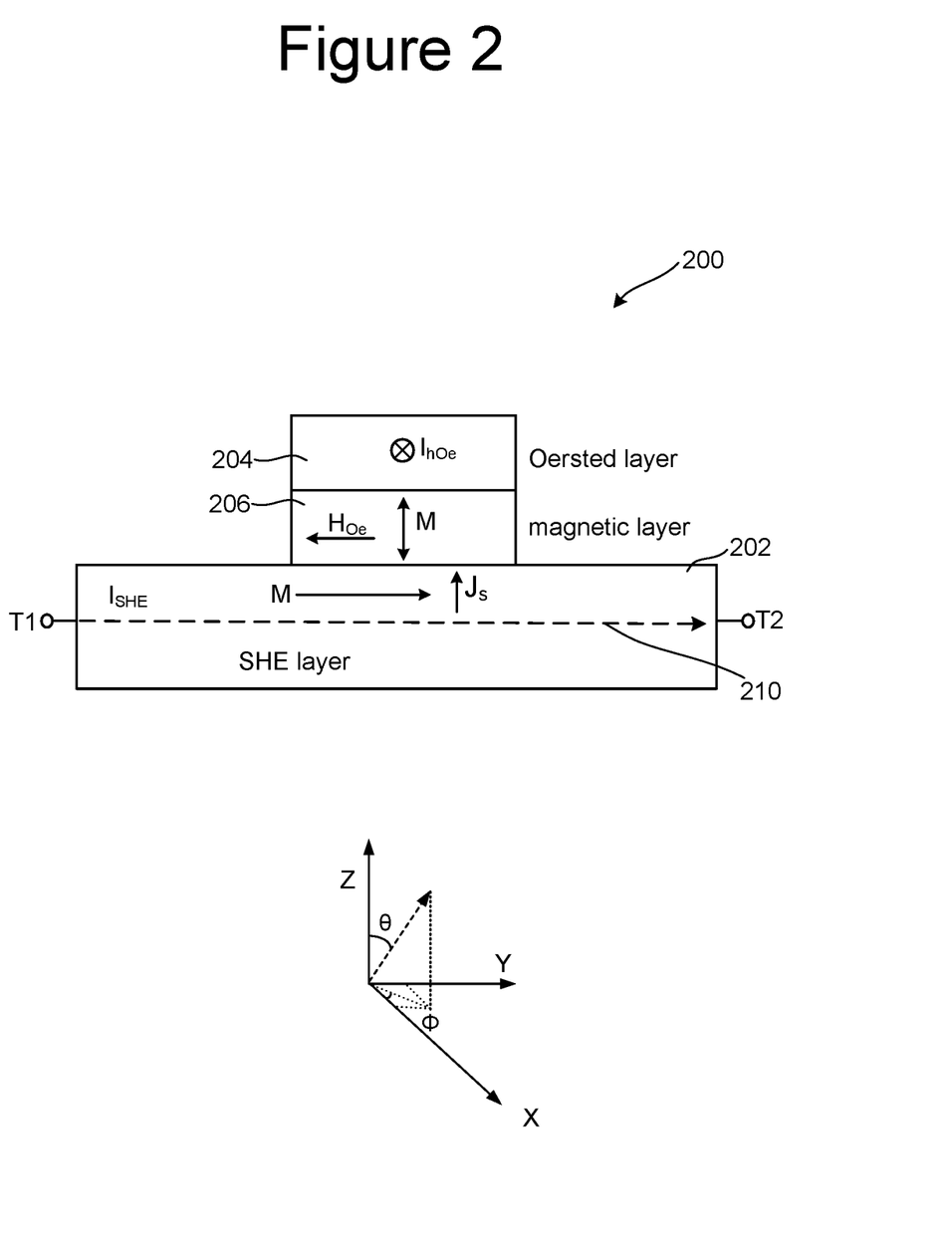
FIG. 2 is a block diagram of a magnetic random access memory ("MRAM") memory cell.

To remedy the above described deficiencies of prior magnetoresistive random access memory cells, a new SOT MRAM memory cell is proposed. FIG. 2 is a side view of one embodiment of the proposed new SOT MRAM memory cell 200. As depicted, memory cell 200 includes a Spin Hall Effect layer 202, an Oersted layer 204 configured to provide heat and an Oersted field in response to an electrical current $I_{hOe}$ through the Oersted layer 204, and a magnetic layer 206 with perpendicular magnetic anisotropy. Magnetic layer 206 is positioned between the Spin Hall Effect layer and the Oersted layer. Magnetic layer 206, which is analogous to a free layer, has a direction of magnetization that can be switched deterministically by combining spin torque from the spin current density $J_s$ generated in the spin Hall effect layer 202 and the Oersted field generated by passing current $I_{hOe}$ through the Oersted layer 204. Thus, in this configuration, the Oersted field provides symmetry breaking field in the y direction that enables deterministic switching of the magnetization M of the magnetic layer 206. For example, FIG. 2 shows that the direction of magnetization of magnetic layer 206 is switchable between up and down, both of which are perpendicular to the plane. In this configuration, MRAM memory cell 200 does not have an MTJ. Rather, the MTJ has been replaced with a single magnetic layer, which can also be referred to as a magnetic bit.

In one embodiment, Oersted layer 204 is a metallic layer on top of and in contact with magnetic layer 206. For example, Oersted layer 204 can be a low resistivity metal that can pass a high current to generate a large Oersted field and heat. Examples of suitable materials for Oersted layer 204 include gold, copper and silver. In response to electrical current $I_{hOe}$ through the Oersted layer 204, the Oersted layer 204 generates Oersted field $H_{Oe}$ parallel to the write current $I_{SHE}$ 210 and generates heat locally that increases the temperature of the magnetic layer 206.

In one embodiment, magnetic layer 206 is a ferromagnetic material with perpendicular anisotropy. Examples of suitable materials include multilayers of Iron and Platinum, Cobalt and Platinum, or Cobalt and Palladium.

In one embodiment, SHE layer 202 is a heavy metal with strong spin orbit coupling and large effective Spin Hall Angle. Examples of suitable materials include Platinum, Tungsten, Tantalum, Platinum Gold (PtAu), Bismuth Copper (BiCu) and topological insulators such as Bismuth Selenide ($Bi_2Se_3$), Bismuth Telluride ($Bi_2Te_3$) or Antimony Telluride ($Sb_2Te_3$).

The threshold current density needed to switch the direction of magnetization of magnetic layer 206 is expressed by equation 1, above. The electrical current $I_{hOe}$ through the Oersted layer 204 serves two purposes. First, electrical current $I_{hOe}$ is used to generate the Oersted field $H_{Oe}$, which is the field $H_Y$ in equation 1. Thus, by generating a strong Oersted field $H_{Oe}$, the threshold current density needed to switch the direction of magnetization of magnetic layer 206 is reduced. Oersted field $H_{Oe}$ also provides a symmetry breaking mechanism to enable deterministic switching. Second, in response to electrical current $I_{hOe}$, heat is created in Oersted layer 204, which heats magnetic layer 206 at the time of writing. Heating magnetic layer 206 provides thermal assistance to switching by reducing $H_K^{eff*}$ in equation 1. Current $I_{hOe}$ generates heat proportional mainly to resistivity of Oersted layer 204 multiplied by the current squared.

To write data to memory cell 200, electrical current $I_{SHE}$ 210 is applied through the SHE layer 202 from terminal T1 to terminal T2. Due to the Spin Hall Effect, spin current density $J_S$ is generated perpendicular to electrical current $I_{SHE}$. Spin current density $J_S$ flows into magnetic layer 206 and exerts a torque on the magnetization M of magnetic layer 206. Electrical current $I_{hOe}$ is applied simultaneously to the applying of electrical current $I_{SHE}$, which generates the Oersted field $H_{Oe}$ and heat, both of which assists the spin current density $J_S$ to switch direction of magnetization of the magnetic layer 206 from a first direction to a second direction. Applying electrical current $I_{SHE}$ in the opposite direction (polarity) through the SHE layer 202 from terminal T2 to terminal T1, switches the direction of magnetization of the magnetic layer 206 from the second direction to the first direction. Electrical current $I_{hOe}$ is unipolar and can have either polarity; however, its polarity will determine which polarity of the electrical current $I_{SHE}$ results in bit up or bit down stable state.

Figure 3:
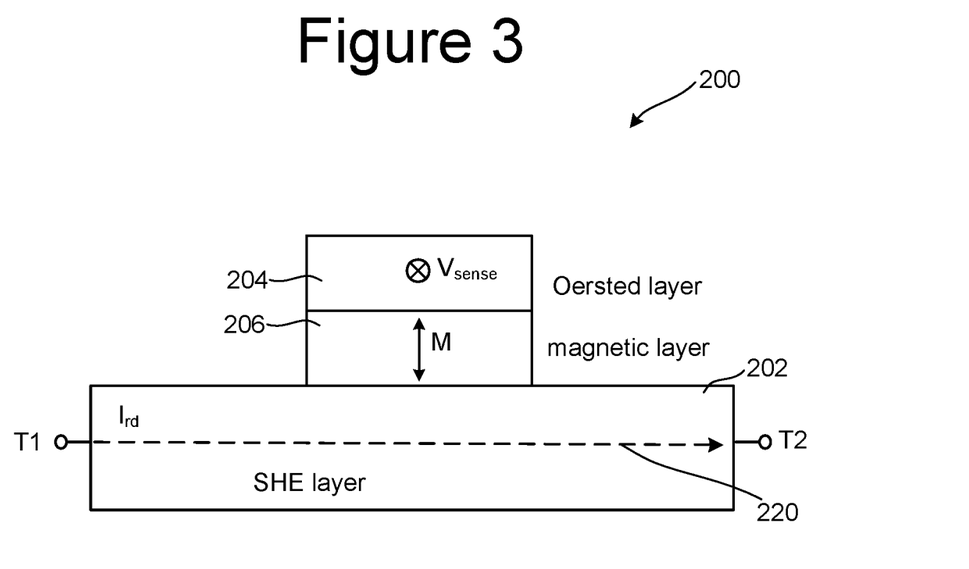
FIG. 3 is a block diagram of a MRAM memory cell.
Figure 4:
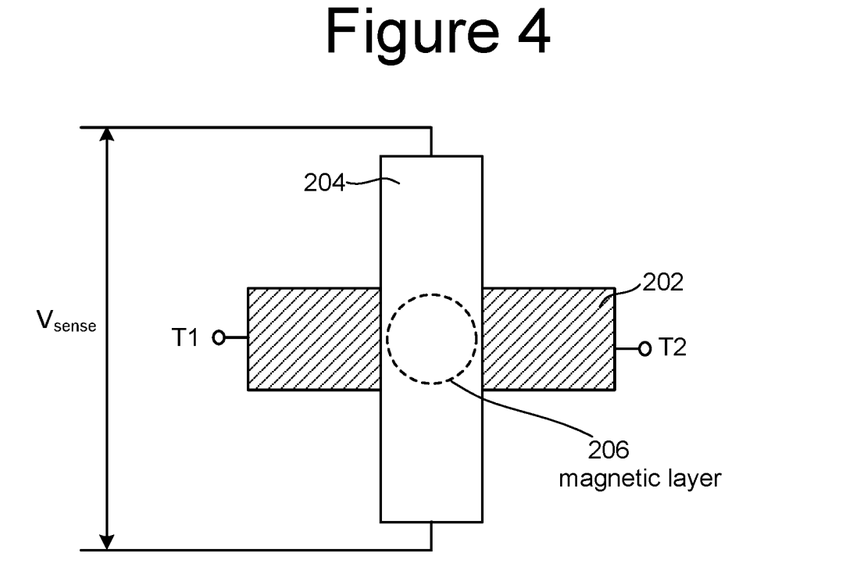
FIG. 4 is a top view of the MRAM memory cell of FIG. 3.

FIGS. 3 and 4 depict memory cell 200 during a read operation. FIG. 3 is a side view of memory cell 200. FIG. 4 is a top view of memory cell 200. Reading can be achieved by passing current $I_{rd}$ 220 through the SHE layer 202 and sensing voltage $V_{sense}$ across Oersted layer 204 (or current though it in the closed circuit) which is generated by the Anomalous Hall Effect in the magnetic layer 206. The anomalous Hall effect (AHE) occurs in solids with broken time-reversal symmetry, typically in a ferromagnetic material, as a consequence of spin-orbit coupling. In response to a current applied through the SHE layer 202 that is partially shunted also through the magnetic layer 206, AHE results in a charge separation across the Oersted layer 204, creating a voltage differential between two sensing points on the Oersted layer 204 that are on the opposite side with respect to the magnetic bit 206. This voltage differential is measured by sensing $V_{sense}$ at Oersted layer 204, as depicted in FIG. 4. For this sensing scheme the system needs to sense only polarity of the voltage $V_{sense}$ (or current $I_{sense}$) across (or through) Oersted layer 204 and not necessarily its magnitude as the polarity of voltage for the given polarity of $I_{rd}$ is directly determined by the magnetization orientation of the magnetic layer 206 (e.g., bit up=positive readout voltage polarity, bit down=negative readout voltage polarity or vice versa depending on the sign of the anomalous Hall effect in the magnetic bit which is a material property). This sensing scheme eliminates the need to use a MTJ and, therefore, it significantly reduces fabrication complexity of the memory and can potentially provide cost advantage. Also magnetic materials with bulk perpendicular anisotropy (such as FePt) can be used for magnetic layer 206, which can result in smaller devices. Additionally, electrical current is never directly passed through magnetic layer 206, thus reducing the risk of device degradation.

Figure 5:
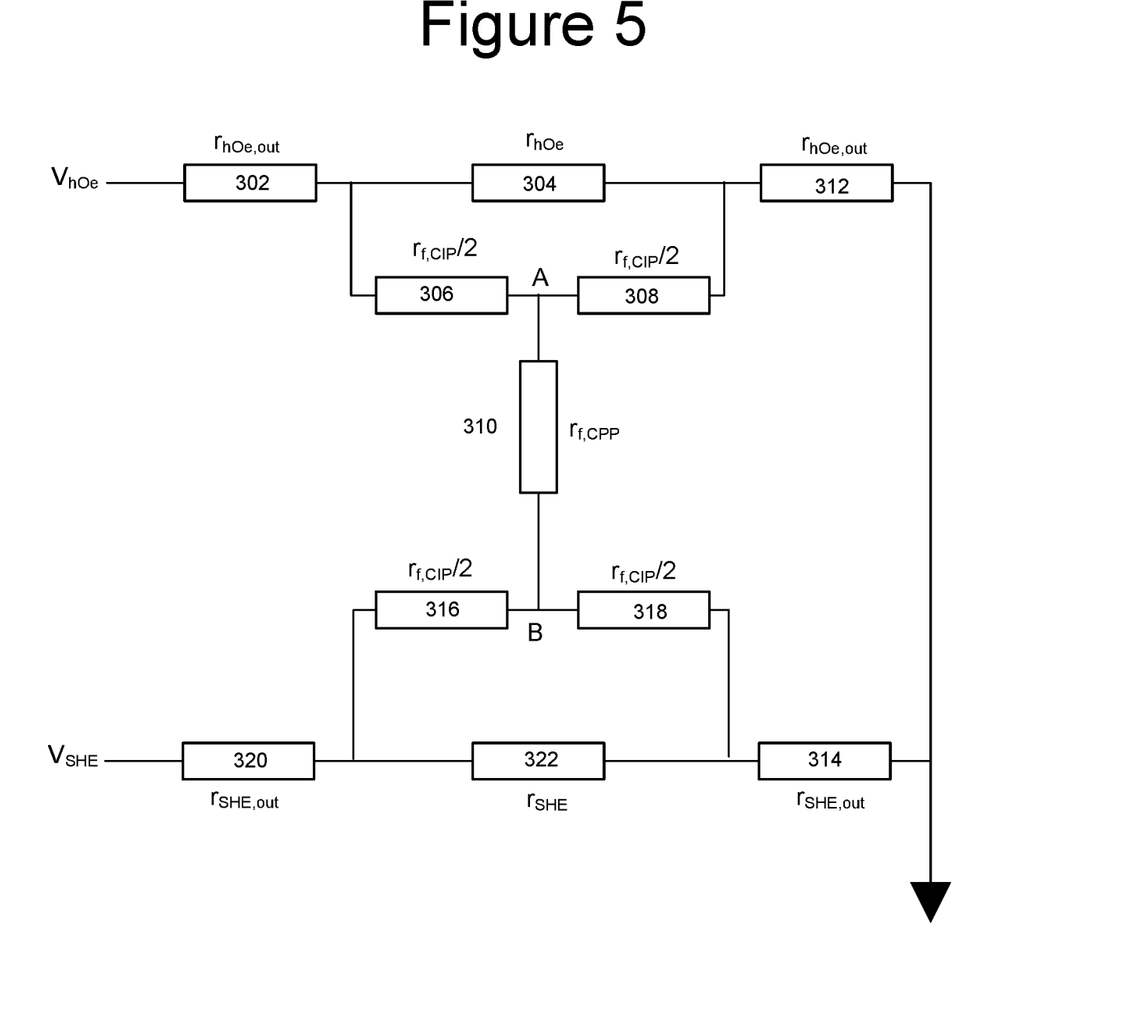
FIG. 5 depicts an equivalent circuit for writing to a MRAM memory cell.

FIG. 5 depicts an equivalent circuit for writing to MRAM memory cell 200. The equivalent circuit includes circuit element 302 having a resistance $r_{hOe,out}$ receiving voltage bias $V_{hOe}$ that is applied to Oersted layer 204. Circuit element 302 is connected to circuit element 304 and circuit element 306. Circuit element 306 is connected to circuit element 308 and circuit element 310. Circuit element 308 is also connected to circuit element 304 and circuit element 312. Circuit element 312 is also connected to circuit element 314 and ground. Circuit element 310 is also connected to circuit element 316 and circuit element 318. Circuit element 320 has a resistance $r_{SHE,out}$, receives voltage bias $V_{SHE}$ that is applied to SHE layer 202, and is connected to circuit element 316 and circuit element 322. Circuit element 318 is also connected to circuit element 314 and circuit element 322. Circuit element 304 has a resistance of $r_{hOe}$. Circuit elements 306 and 308 each have a resistance of $(½)r_{f,CIP}$. Circuit element 310 has a resistance of $r_{f,CPP}$. Circuit element 312 has a resistance of $r_{hOe,out}$. Circuit element 314 has a resistance of $r_{SHE,out}$. Circuit elements 316 and 318 each have a resistance of $(½)r_{f,CIP}$. Circuit element 22 has a resistance of $r_{SHE}$.

In the circuit of FIG. 5, $r_{f,CIP}$ is the resistance of the magnetic layer 206 to current flowing in plane, $r_{f,CPP}$ is the resistance of the magnetic layer 206 to current flowing perpendicular to the plane, $r_{hOe,out}$ is the resistance of the portion of the Oersted layer 204 away from the magnetic layer 206 to current flowing in plane, $r_{hOe}$ is the resistance of the portion of the Oersted layer 204 above the magnetic layer 206 to current flowing in plane, $r_{SHE}$ is the resistance of the portion of the SHE layer 202 right under the magnetic layer 206 to current flowing in plane, and $r_{SHE,out}$ is the resistance of the portion of the SHE layer 202 away from the magnetic layer 206 to current flowing in plane.

To prevent current flow through the magnetic layer 206, either: (a) $r_{f,CPP} \gg r_{hOe}$, $r_{SHE}$ or (b) adjust $V_{hOe}$, $r_{hOe,out}$, $V_{SHE}$, and $r_{SHE,out}$ so that nodes A and B are equipotential. Note that $r_{hOe,out}$ and $r_{SHE,out}$ on left and right can be different. Also $r_{f,CIP}$ under hOe line can be different than $r_{f,CIP}$ above SHE line as currents flowing through the magnetic layer 206 are orthogonal and can encounter different resistances (e.g. due to different grain boundary scattering or due to different lengths in the two directions). Also, hOe line does not have to share ground with the SHE line but can be closed.

Figure 6:
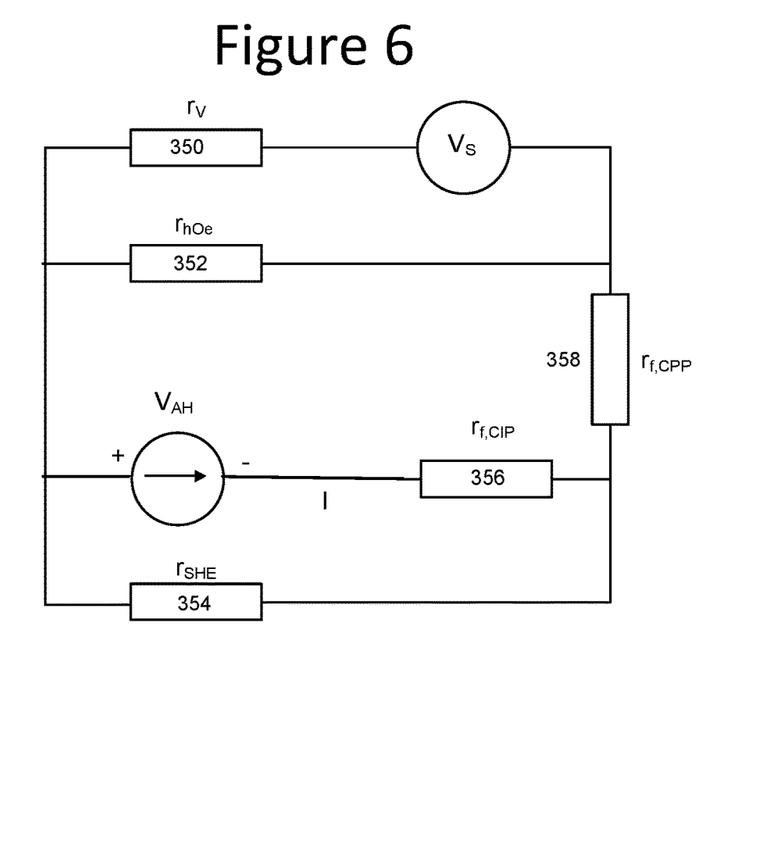
FIG. 6 depicts an equivalent circuit for reading from a MRAM memory cell.

FIG. 6 depicts one example of an equivalent circuit for reading from a MRAM memory cell where the direction of magnetization of the magnetic layer 206 is read by sensing voltage at the Oersted layer 204. $V_{AH}$ is the voltage generated at the magnetic layer 206 due to the Anomalous Hall Effect in magnetic layer 206. The voltage source representing $V_{AH}$ is connected at its positive terminal to circuit elements 350, 352 and 354, and at its negative terminal to circuit element 356. Circuit element 356 is also connected to circuit element 354 and circuit element 358. The voltage $V_S$ (representing a voltmeter) is connected to circuit element 350 on one side, and to circuit elements 352 and 358 on the other side.

Circuit element 350 has a resistance of $r_V$, representing the voltmeter input resistance. Circuit element 352 has a resistance of $r_{hOe}$, representing the resistance across the Oersted layer 204. Circuit element 354 has a resistance of $r_{SHE}$, representing the resistance across the SHE layer 202, orthogonal to the bias current. Circuit element 356 has a resistance of $r_{f,CIP}$, representing an internal source resistance of magnetic layer 206 for current in plane. Circuit element 358 has a resistance of $r_{f,CPP}$, representing an internal source resistance of magnetic layer 206 for current perpendicular to the plane.

Figure 7:
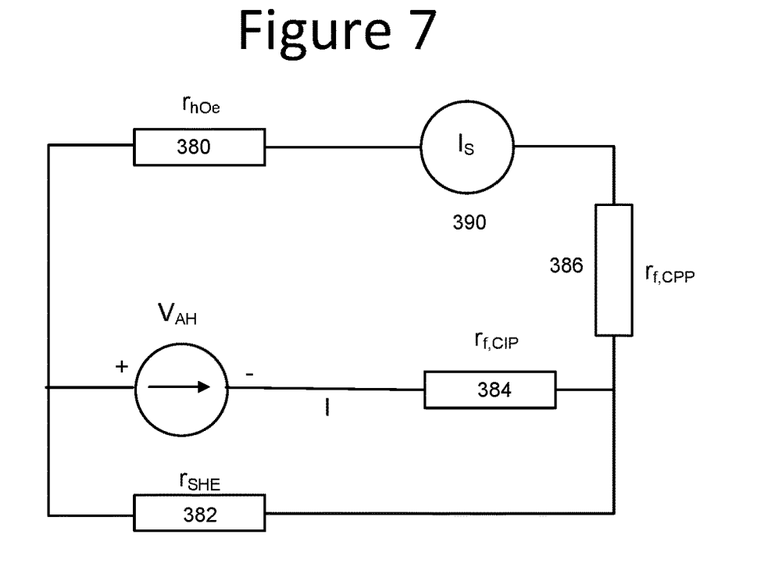
FIG. 7 depicts an equivalent circuit for reading from a MRAM memory cell.

FIG. 7 depicts one example of an equivalent circuit for reading from a MRAM memory cell, where the direction of magnetization of the magnetic layer 206 is read by sensing current Is at the Oersted layer 204. The voltage source representing $V_{AH}$ is connected at its positive terminal to circuit elements 380 and 382, and at its negative terminal to circuit element 384. Circuit element 384 is also connected to circuit element 382 and circuit element 386. Ammeter 390 is connected to and between circuit elements 380 and 386. Circuit element 380 has a resistance of $r_{hOe}$. Circuit element 382 has a resistance of $r_{SHE}$. Circuit element 384 has a resistance of $r_{f,CIP}$. Circuit element 358 has a resistance of $r_{f,CPP}$.

With respect to FIGS. 6 and 7, in order to maximize the output signal, some embodiments (not all embodiments) satisfy the following property: $r_{f,CIP}+r_{f,CPP} \ll r_{hOe}$. Furthermore, in order to make sure that read bias current through the SHE layer is not flowing through the magnetic layer in perpendicular direction and then through the hOe layer, for the given voltage in the SHE layer the Oersted layer should be pre-biased to the same voltage as the SHE layer.

Figure 8A:
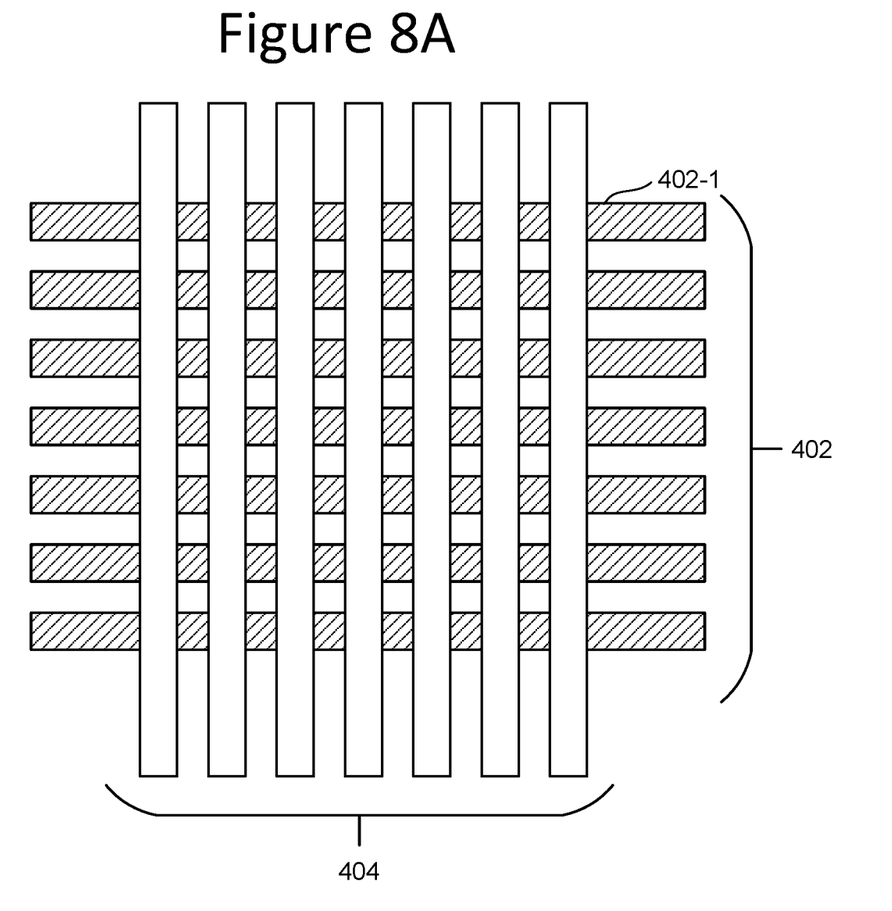
FIG. 8A depicts a cross point array of MRAM memory cells.

In one embodiment, a plurality of memory cells of the structure depicted in FIG. 2 can be used to form a cross point array of MRAM memory cells. Other types of arrays of memory cells can also be formed. FIG. 8A is a top view of one example of a cross point array of MRAM memory cells, where the memory cells are of the structure depicted in FIG. 2. The cross point array includes a plurality of bit lines 404 and a plurality of word lines 402 that are orthogonal to the bit lines. Each of the bit lines 404 comprises the Oersted layer 204 for the associated set of memory cells. Each of the word lines 402 comprises the SHE layer 202 for the associated set of memory cells. Between the word lines 402 and the bit lines 404, and at the intersection of the word lines 402 and the bit lines 404, are magnetic layers 206 (also referred to as magnetic bits). Although FIG. 8A shows seven word lines and seven bit lines, more than seven word lines and seven bit lines can also be implemented.

Figure 8B:
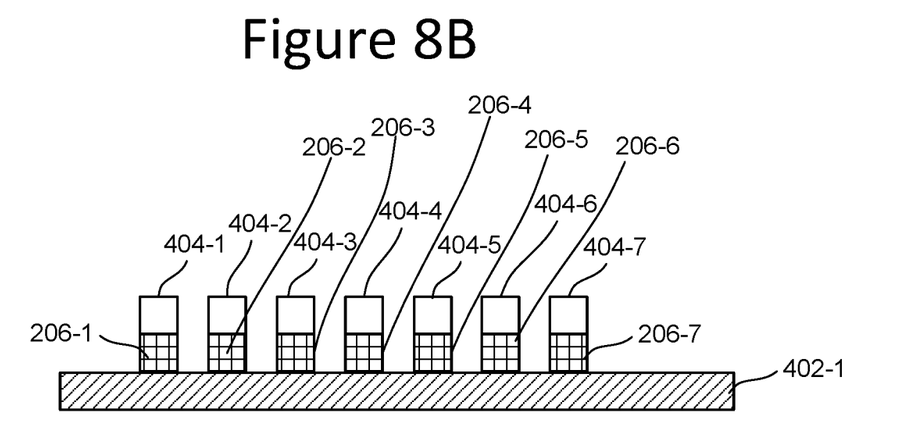
FIG. 8B is a side view of the cross point array of FIG. 8A.

FIG. 8B is a side view of the cross point array of FIG. 8A. FIG. 8B shows cross section along word line 402-1, which is one of the plurality of word lines 402 depicted in FIG. 8A. In FIG. 8B, the bit lines 404 are numbered 404-1, 404-2, 404-3, 404-4, 404-5, 404-6, and 404-7. Between the word line 402-1 and the bit lines 404-1 through 404-7, and at the intersection of the word line 402-1 and the bit lines, are magnetic layers 206. For example, between word line 402-1 and bit line 404-1 is magnetic layer 206-1 forming a memory cell. Between word line 402-1 and bit line 404-2 is magnetic layer 206-2 forming a memory cell. Between word line 402-1 and bit line 404-3 is magnetic layer 206-3 forming a memory cell. Between word line 402-1 and bit line 404-4 is magnetic layer 206-4 forming a memory cell. Between word line 402-1 and bit line 404-5 is magnetic layer 206-5 forming a memory cell. Between word line 402-1 and bit line 404-6 is magnetic layer 206-6 forming a memory cell. Between word line 402-1 and bit line 404-7 is magnetic layer 206-7 forming a memory cell.

Figure 9:
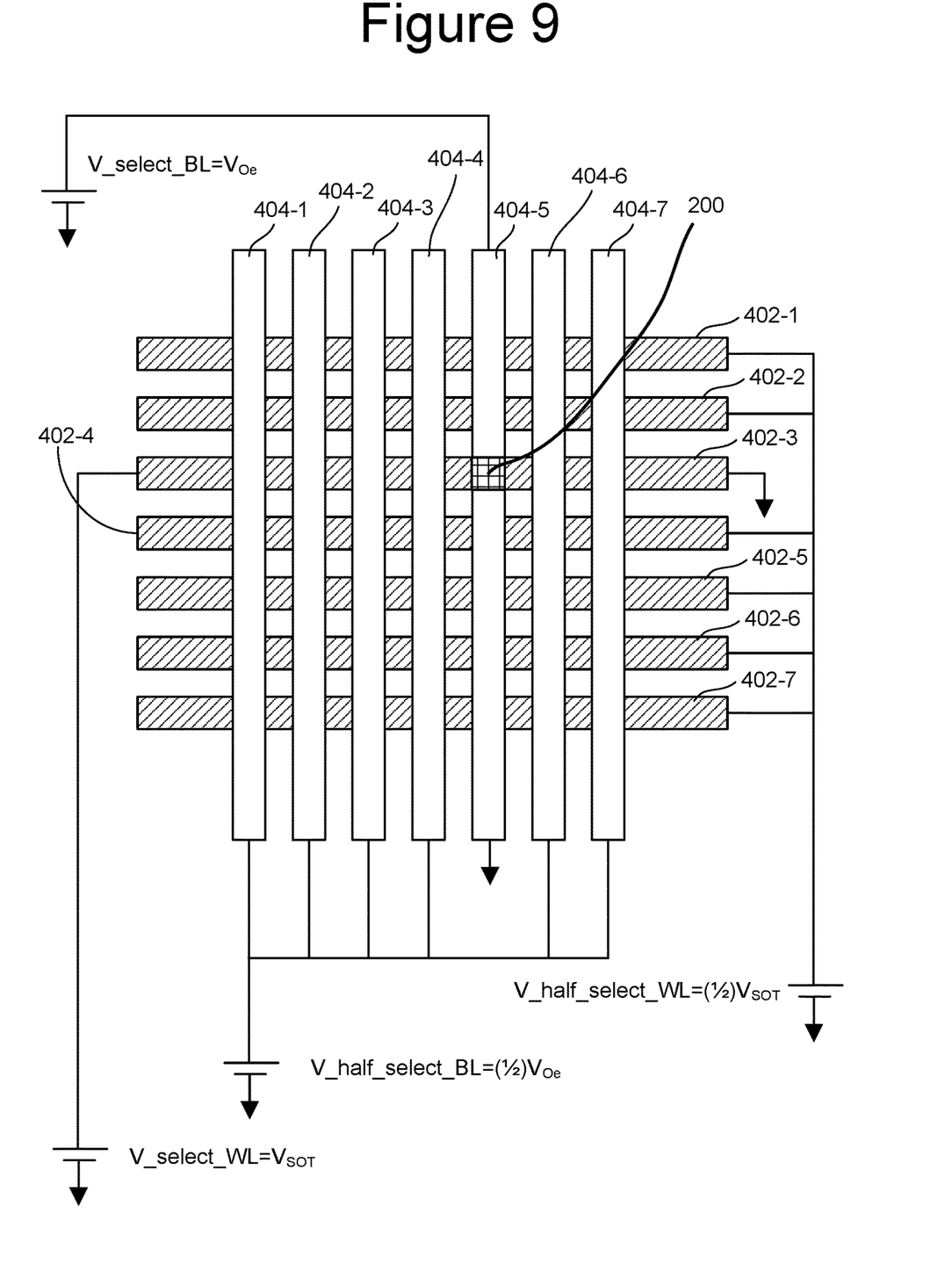
FIG. 9 depicts the cross point array of MRAM memory cells during a write operation.

FIG. 9 depicts an example configuration of the cross point array of MRAM memory cells during a write operation. Memory cell 200, at the intersection of word line 402-3 and bit line 404-5, is selected for the write operation; therefore, word line 402-3 is the selected word line and bit line 404-5 is the selected bit line. Selected word line 402-3 is connected to a voltage of $V_{SOT}$ (V_select_WL=$V_{SOT}$) at one end and to ground at the other end. In one embodiment, $V_{SOT}$ can be between 0.5 V and 5 V. The other word lines (402-1, 402-2, 402-4, 402-5, 402-6 and 402-7) are connected to half of the voltage of the selected word line (V_half_select_WL=(½) $V_{SOT}$) at one end and are floated at the other end (or connected to the same voltage). Selected bit line 404-5 is connected to a voltage of $V_{Oe}$ (V_select_BL=$V_{Oe}$) at one end and to ground at the other end. In one embodiment, $V_{Oe}$ can be between 0.5 V and 5 V. The other bit lines (404-1, 404-2, 404-3, 404-4, 404-6, and 404-7) are connected to half of the voltage of the selected bit line (V_half_select_BL= (½)$V_{Oe}$) at one end and are floated at the other end (or connected to the same voltage).

Figure 10:
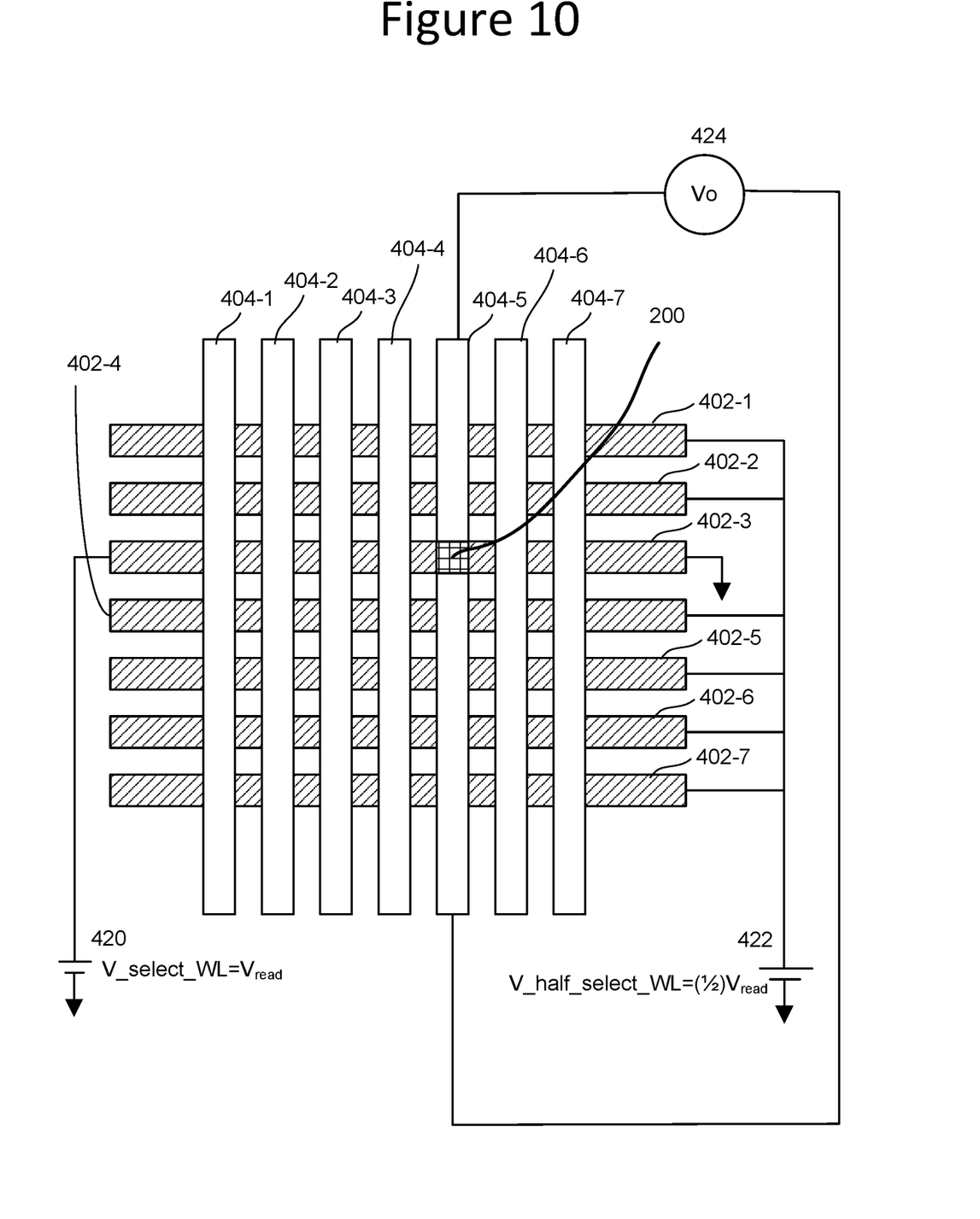
FIG. 10 depicts the cross point array of MRAM memory cells during a read operation.

FIG. 10 depicts the cross point array of MRAM memory cells during a read operation. Memory cell 200, at the intersection of word line 402-3 and bit line 404-5, is selected for the read operation; therefore, word line 402-3 is the selected word line and bit line 404-5 is the selected bit line. Selected word line 402-3 is connected to a voltage $V_{read}$ (V_select_WL=$V_{read}$) at one end and to ground at the other end. In one embodiment, $V_{read}$ can be between 0.1 V and 5 V. The other word lines (402-1, 402-2, 402-4, 402-5, 402-6 and 402-7) are connected to half of the voltage of the selected word line (V_half_select_WL=(½)$V_{read}$) at one end and are floated at the other end (or connected to the same voltage). An output voltage $V_O$ is sensed across selected bit line 404-5. The unselected bit lines (404-1, 404-2, 404-3, 404-4, 404-6, and 404-7) are floated.

Figure 11:
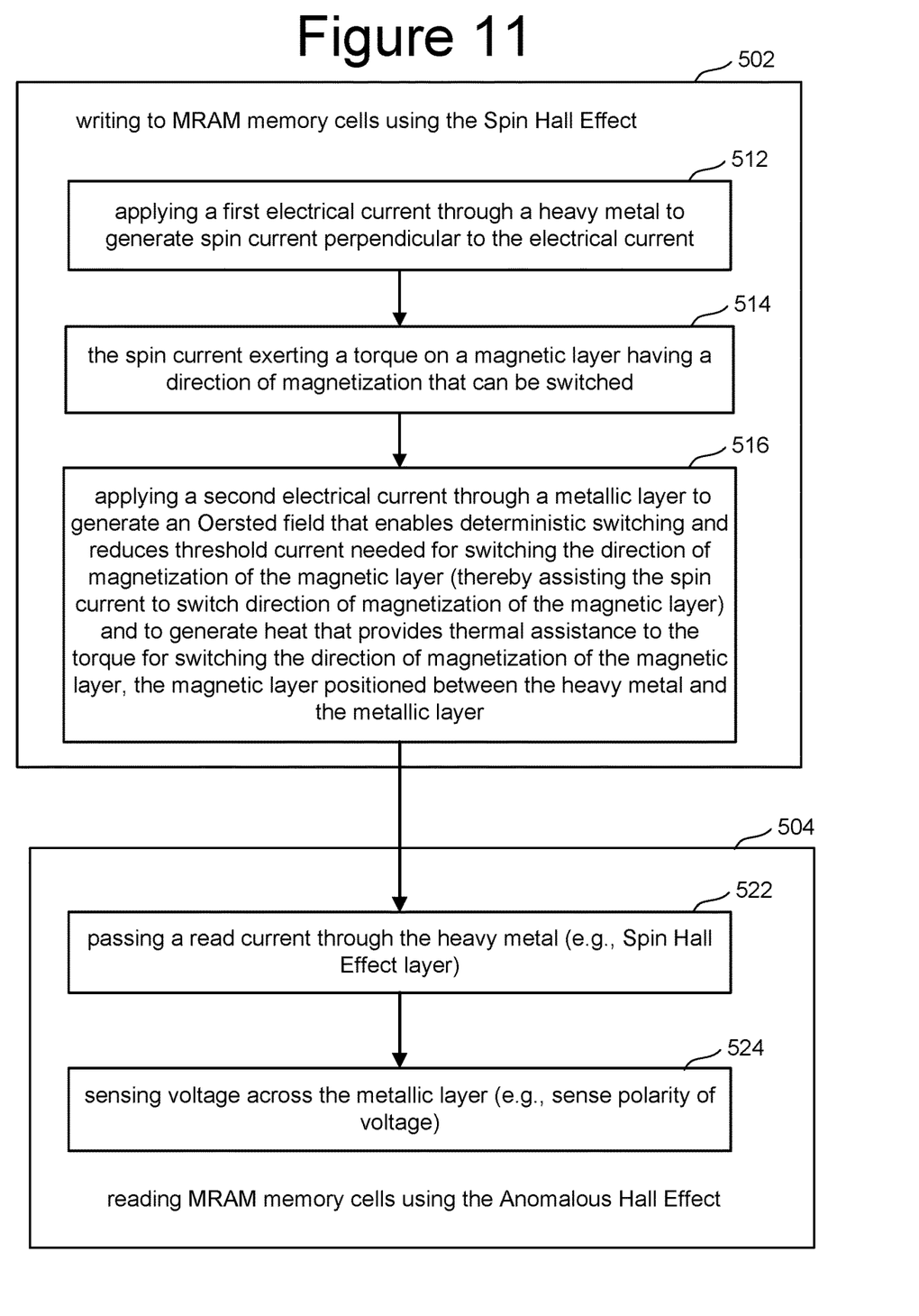
FIG. 11 is a flow chart describing one embodiment of operating MRAM memory.

FIG. 11 is a flow chart describing one embodiment of operating MRAM memory. Step 502 comprises writing to MRAM memory cells using the Spin Hall Effect, as discussed above. Step 504 comprises reading MRAM memory cells using the Anomalous Hall Effect, as discussed above. In one embodiment, the writing to the MRAM memory cells of step 502 comprises applying a first electrical current through a heavy metal (e.g., SHE layer) to generate spin current perpendicular to the electrical current (step 512); the spin current exerting a torque on a magnetic layer having a direction of magnetization that can be switched (step 514); and applying a second electrical current through a metallic layer (e.g., Oersted layer) to generate an Oersted field that enables deterministic switching and reduces threshold current needed for switching the direction of magnetization of the magnetic layer (thereby assisting the spin current to switch direction of magnetization of the magnetic layer) and to generate heat that provides thermal assistance to the torque for switching the direction of magnetization of the magnetic layer (step 516). In one embodiment, the reading MRAM memory cells of step 504 comprises passing a read current through the heavy metal (e.g., SHE layer) and sensing voltage across the Oersted (metallic) layer (e.g., sense polarity of voltage).

Figure 12:
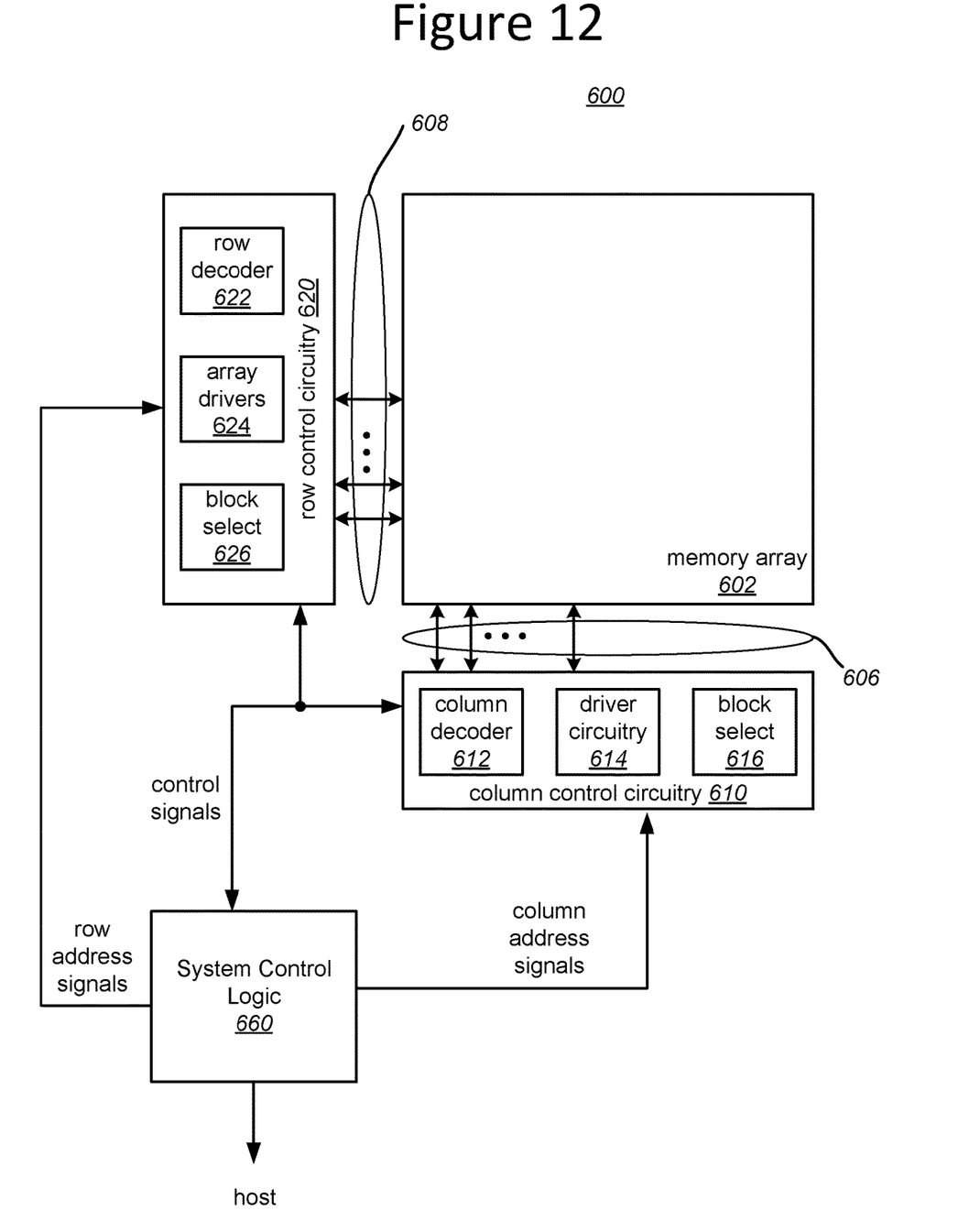
FIG. 12 is a block diagram of a memory system that includes MRAM memory cells.

FIG. 12 is a block diagram that depicts one example of a memory system 600 that can implement the technology described herein. Memory system 600 includes a memory array 602 that includes a plurality of the memory cells depicted in FIG. 2. Memory array 602 may be a cross point array, as depicted in FIGS. 8A, 8B, 9 and 10. The array terminal lines of memory array 602 include the various layer(s) of word lines organized as rows, and the various layer(s) of bit lines organized as columns. However, other orientations can also be implemented. Memory system 600 includes row control circuitry 620, whose outputs 608 are connected to respective word lines of the memory array 602. Row control circuitry 620 receives a group of M row address signals and one or more various control signals from System Control Logic circuit 660, and typically may include such circuits as row decoders 622, array terminal drivers 624, and block select circuitry 626 for both reading and writing operations. Memory system 600 also includes column control circuitry 610 whose input/outputs 606 are connected to respective bit lines of the memory array 602. Column control circuitry 606 receives a group of N column address signals and one or more various control signals from System Control Logic 660, and typically may include such circuits as column decoders 612, array terminal receivers or drivers 614, block select circuitry 616, as well as read/write circuitry, and I/O multiplexers. System control logic 660 receives data and commands from a host and provides output data to the host and status. In other embodiments, system control logic 660 receives data and commands from a separate controller circuit and provides output data to that controller circuit, with the controller circuit communicating with the host. System control logic 660 may include one or more state machines, registers and other control logic for controlling the operation of memory system 600.

In one embodiment, all of the components depicted in FIG. 12 are arranged on a single integrated circuit. For example, system control logic 660, column control circuitry 610 and row control circuitry 620 are formed on the surface of a substrate and memory array 602 is formed one or above the substrate.

In one embodiment, system control logic 660 is a control circuit that operate memory array 602. In other embodiments, the control circuit can also include a controller, or the control circuit can include a controller without including system control logic 660. In any of these embodiments, the control circuit is an electrical circuit that is connected (directly or indirectly) to the memory array for controlling/operating the memory array. For example, the control circuit may perform the writing and reading of FIG. 11. The control circuit can also be a microprocessor, microcontroller, state machine or other type of processor.

The above discussion proposes a new structure and new operation for a MRAM memory cell that will switch deterministically and store data reliably.

Figure 13:
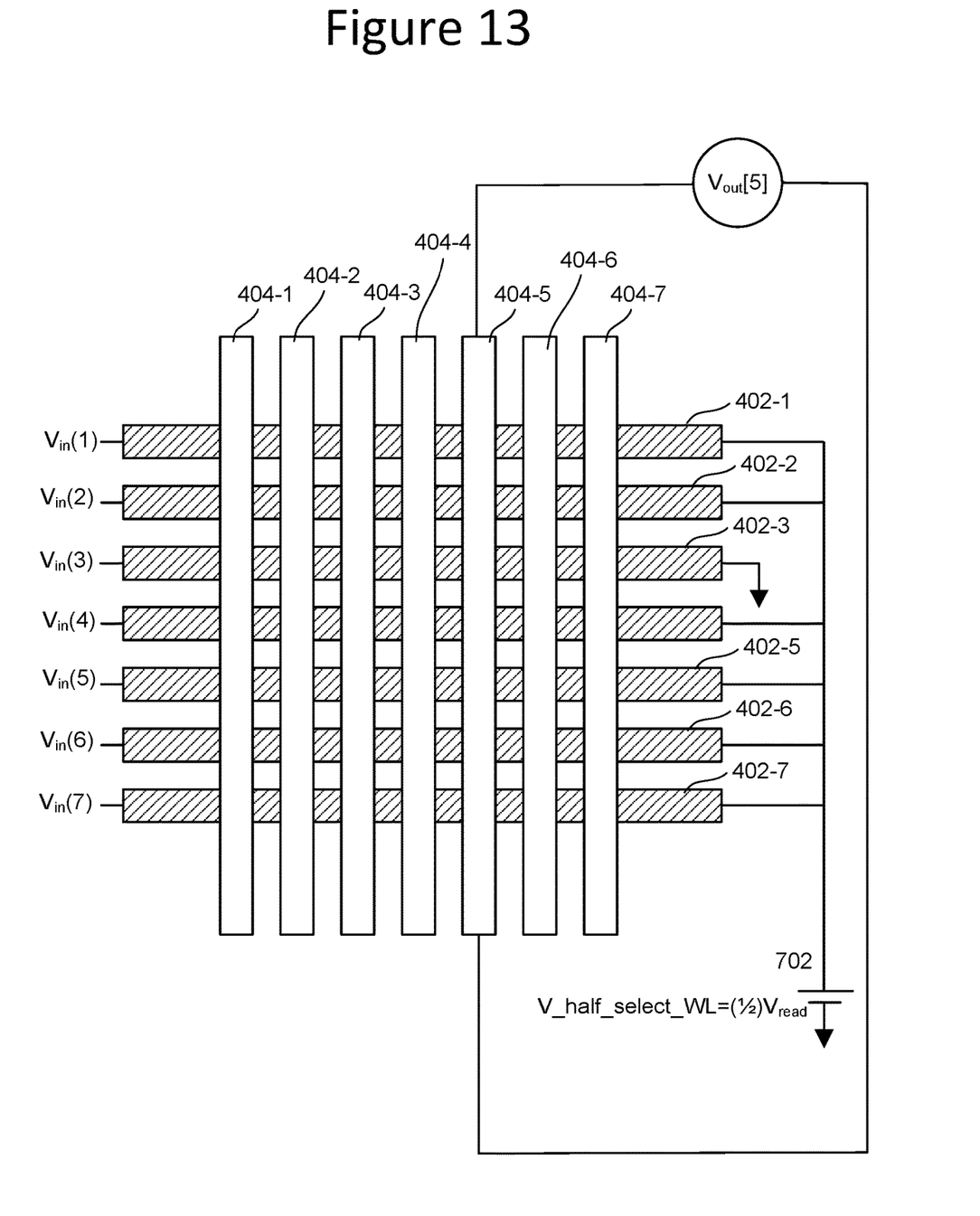
FIG. 13 depicts a cross point array of MRAM memory cells operating as an inference engine.

FIG. 13 depicts a cross point array of MRAM memory cells 200 operating as an inference engine. One example function of such a cross point array operating as an inference engine is to speed up matrix multiplication. The output of the inference engine is determined by measuring the voltage $V_{out}$, as per equation 2:

$$V_{out}[j] = \sum_{i=0}^{N} V_{in}(i) * M_{ij} \quad \text{Equation 2}$$

The variable j represent the bit line. Each $V_{out}[j]$ is the measured voltage across bit line j. For example, FIG. 13 depicts the measuring of $V_{out}[5]$ as the voltage across bit line 404-5. Each of the inputs $V_{in}(i)$ represents the voltage input to word line i. For example, $V_{in}(1)$ is the voltage input to word line 402-1, $V_{in}(2)$ is the voltage input to word line 402-2, $V_{in}(3)$ is the voltage input to word line 402-3, $V_{in}(4)$ is the voltage input to word line 402-4, $V_{in}(5)$ is the voltage input to word line 402-5, $V_{in}(6)$ is the voltage input to word line 402-6, and $V_{in}(7)$ is the voltage input to word line 402-7. Each of the elements $M_{ij}$ of the matrix can be a "0" or a "1" by writing the appropriate data, as explained above to the memory cell at the intersection of word line i and bit line j. Once each of the memory cells are appropriately programmed (e.g., based on training of a neural network), then applying the input voltages $V_{in}(i)$ for i+1 to 7 results in the system able to read the output voltages $V_{out}[j]$ as per Equation 2. Note that the example of FIG. 13 is a seven by seven cross point array; however, other sizes can also be implemented including more or less than seven word lines and/or more or less than seven bit lines.

The above discussion regarding FIG. 13 provides one example use of the newly proposed MRAM technology. Other uses can also be implemented, including embedded memory, removable memory cards, Solid State Drives, main memory, etc.

One embodiment of the proposed technology includes a magnetic random-access memory ("MRAM") memory, comprising: a Spin Hall Effect layer; an Oersted layer configured to provide an Oersted field in response to an electrical current through the Oersted layer; and a magnetic layer with perpendicular magnetic anisotropy. The magnetic layer is positioned between the Spin Hall Effect layer and the Oersted layer. The magnetic layer has a direction of magnetization that can be switched. The Spin Hall Effect layer is configured to generate spin current perpendicular to an electrical current through the Spin Hall Effect layer in order to exert a torque on the magnetic layer to switch the direction of magnetization. The Oersted layer is configured to provide heat to the magnetic layer in response to the electrical current through the Oersted layer, such that the Oersted field enables deterministic switching of the magnetic layer and the Oersted field and the heat assist the spin current to switch the direction of magnetization of the magnetic layer. When reading, the Oersted layer is configured to provide a voltage indicative of the direction of magnetization of the magnetic layer based on the Anomalous Hall Effect in response to a read current through the Spin Hall Effect layer that is partially shunted through the magnetic layer.

One embodiment for operating the MRAM memory comprises writing to a MRAM memory cell using the Spin Hall Effect and reading the MRAM memory cell using the Anomalous Hall Effect.

One embodiment comprises a first current driving layer; a second current driving layer; a ferromagnetic layer between the first current driving layer and the second current driving layer, the ferromagnetic layer having a direction of magnetization that can be switched; and a control circuit connected to the first current driving layer and the second current driving layer. The control circuit is configured to change the direction of magnetization of the ferromagnetic layer by applying electrical currents through the first layer and the second layer without applying an electrical current through the ferromagnetic layer. The control circuit is configured to read the direction of magnetization of the ferromagnetic layer by applying an electrical current through the first current driving layer and sensing polarity of voltage across the second current driving layer. In one example implementation, the control circuit is configured to change the direction of magnetization of the ferromagnetic layer using the Spin Hall Effect based on the current through the first current driving layer and to read the direction of magnetization of the ferromagnetic layer using the Anomalous Hall Effect based on a read current through the first current driving layer.

One embodiment includes a magnetic random-access memory, comprising a plurality of word lines; a plurality of bit lines; a ferromagnetic layer located at the intersection of word lines and bit lines, the ferromagnetic layer having a direction of magnetization that can be switched; and a control circuit connected to the word lines and the bit lines, the control circuit is configured to supply a first current through a selected word line and a second current through a selected bit line, the control circuit is configured to change the direction of magnetization of the ferromagnetic layer by applying electrical currents through the bit lines and word lines without applying an electrical current through the ferromagnetic layer, the control circuit is configured to read the direction of magnetization of the ferromagnetic layer by applying an electrical current through the selected word line and sensing polarity of voltage across the bit line.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A magnetic random-access memory, comprising:
   a Spin Hall Effect layer;
   an Oersted layer configured to provide an Oersted field in response to an electrical current through the Oersted layer; and
   a magnetic layer with perpendicular magnetic anisotropy, the magnetic layer is positioned between the Spin Hall Effect layer and the Oersted layer, the magnetic layer has a direction of magnetization that can be switched in response to a current through the Spin Hall Effect layer and the Oersted field, the Oersted layer is configured to provide an electrical signal having a polarity indicative of the direction of magnetization of the magnetic layer in response to a read current through the Spin Hall Effect layer.

2. The magnetic random-access memory of claim 1, wherein:
   the Spin Hall Effect layer is configured to generate spin current perpendicular to an electrical current through the Spin Hall Effect layer in order to exert a torque on the magnetic layer to switch the direction of magnetization.

3. The magnetic random-access memory of claim 2, wherein:
   the Oersted layer is configured to provide heat to the magnetic layer in response to the electrical current through the Oersted layer, the heat assists switching the direction of magnetization of the magnetic layer.

4. The magnetic random-access memory of claim 2, wherein:
   the Oersted field enables the spin current to switch direction of magnetization of the magnetic layer deterministically.

5. The magnetic random-access memory of claim 2, wherein:
   the Oersted field reduces threshold current needed for switching the direction of magnetization of the magnetic layer.

6. The magnetic random-access memory of claim 2, wherein:
   the Oersted layer is configured to generate the Oersted field parallel to the current through the Spin Hall Effect layer in response to the electrical current through the Oersted layer, the Oersted field assists in switching direction of magnetization of the magnetic layer.

7. The magnetic random-access memory of claim 2, wherein:
   the Oersted layer is configured to provide the electrical signal having the polarity indicative of the direction of magnetization of the magnetic layer—based on the Anomalous Hall Effect in response to the read current through the Spin Hall Effect layer.

8. The magnetic random-access memory of claim 1, wherein:
   the Oersted layer is a first current driving layer; and
   the Spin Hall Effect layer is a second current driving layer orthogonal to the first current driving layer.

9. The magnetic random-access memory of claim 1, wherein:
   the Oersted layer is configured to provide the electrical signal having the polarity indicative of the direction of magnetization of the magnetic layer without passing a current through a magnetic tunnel junction; and
   the magnetic random-access memory does not include a magnetic tunnel junction.

10. The MRAM memory of claim 1, wherein:
    the magnetic layer is ferromagnetic;
    the Oersted layer is a low resistivity metal that can pass a high current to generate a large Oersted field and heat; and
    the Spin Hall Effect layer is a heavy metal.

11. The MRAM memory of claim 1, wherein:
    the Oersted layer, the Spin Hall Effect layer and the magnetic layer are part of a cross point array.

12. The magnetic random-access memory of claim 1, wherein:
    the electrical signal comprises a voltage across the Oersted layer,
    a first polarity of the voltage across the Oersted layer represents a first direction of magnetization of the ferromagnetic layer; and
    a second polarity of the voltage across Oersted layer represents a second direction of magnetization of the ferromagnetic layer.

13. The magnetic random-access memory of claim 1, wherein:
    the electrical signal comprises a current through the Oersted layer.

14. A magnetic random-access memory, comprising:
    a plurality of word lines;
    a plurality of bit lines;
    a ferromagnetic layer located at the intersection of word lines and bit lines, the ferromagnetic layer having a direction of magnetization that can be switched; and
    a control circuit connected to the word lines and the bit lines, the control circuit is configured to supply a first current through a selected word line and a second current through a selected bit line, due to the Spin Hall Effect the first current through the selected word line generates spin current perpendicular to the first current in order to exert a torque on the ferromagnetic layer to switch the direction of magnetization of the ferromagnetic layer, the control circuit is configured to change the direction of magnetization of the ferromagnetic layer by applying electrical currents through the bit lines and word lines without applying an electrical current through the ferromagnetic layer, the control circuit is configured to read the direction of magnetization of the ferromagnetic layer by applying an electrical current through the selected word line and sensing polarity of voltage across the bit line such that a first polarity of the voltage across the bit line represents a first direction of magnetization of the ferromagnetic layer and a second polarity of the voltage across the bit line represents a second direction of magnetization of the ferromagnetic layer.

15. The magnetic random-access memory of claim 14, wherein:
the control circuit is configured to read the direction of magnetization of the ferromagnetic layer by applying an electrical current through the selected word line, which causes the ferromagnetic layer to generate the voltage sensed across the bit line due to the Anomalous Hall Effect in the ferromagnetic layer.

16. The magnetic random-access memory of claim 14, wherein:
direction of magnetization of the ferromagnetic layer is changed and read without using a magnetic tunnel junction.

17. A magnetic random-access memory, comprising:
a Spin Hall Effect layer;
an Oersted layer configured to provide an Oersted field in response to an electrical current through the Oersted layer; and
a magnetic layer with perpendicular magnetic anisotropy, the magnetic layer is positioned between the Spin Hall Effect layer and the Oersted layer, the magnetic layer has a direction of magnetization that can be switched, the Spin Hall Effect layer is configured to generate spin current perpendicular to an electrical current through the Spin Hall Effect layer in order to exert a torque on the magnetic layer to switch the direction of magnetization without using a magnetic tunnel junction.

18. The magnetic random-access memory of claim 17, wherein:
the Oersted layer is configured to provide heat to the magnetic layer in response to the electrical current through the Oersted layer, the heat assists switching the direction of magnetization of the magnetic layer.

19. The magnetic random-access memory of claim 17, wherein:
the Oersted layer is configured to generate the Oersted field parallel to the current through the Spin Hall Effect layer in response to the electrical current through the Oersted layer, the Oersted field assists in switching direction of magnetization of the magnetic layer.

\* \* \* \* \*